United States Patent [19]

Keida

[11] Patent Number: 5,003,202
[45] Date of Patent: Mar. 26, 1991

[54] COINCIDENCE EXTENDABLE PROGRAMMABLE LOGIC DEVICE

[75] Inventor: Hisaya Keida, Ichikawa, Japan

[73] Assignee: Kawasaki Steel Corporation, Hyogo, Japan

[21] Appl. No.: 295,348

[22] Filed: Jan. 10, 1989

[30] Foreign Application Priority Data

| Jan. 14, 1988 | [JP] | Japan | 63-6197 |
| Jul. 28, 1988 | [JP] | Japan | 63-189445 |
| Oct. 31, 1988 | [JP] | Japan | 63-275528 |

[51] Int. Cl.$^5$ .................................... H03K 19/094
[52] U.S. Cl. ................................... 307/465; 307/469; 307/272.2
[58] Field of Search .................. 307/448–449, 307/451, 465, 468–469, 236, 242, 243, 584, 272.2; 328/110

[56] References Cited

U.S. PATENT DOCUMENTS

| 4,508,977 | 4/1985 | Page et al. | 307/468 |
| 4,524,430 | 6/1985 | Page | 307/468 X |
| 4,609,838 | 9/1986 | Huang | 307/465 |
| 4,713,557 | 12/1987 | Carter | 307/242 |
| 4,758,745 | 7/1988 | El Gamal et al. | 307/468 X |
| 4,774,421 | 9/1988 | Hartmann et al. | 307/468 X |

OTHER PUBLICATIONS

Hsieh et al., "A 9000-Gate-User-Programmable Gate Array," IEEE 1988 Custom Integrated Circuits Conference, pp. 15.3.1–15.3.7, (May 16–19, 1988).

El Gamal et al., "An Architecture for Electrically Configurable Gate Arrays," IEEE 1988 Custom Integrated Circuits Conference, pp. 15.4.1–15.4.4. (May 16–19, 1988).

Principles of CMOS VLSI Design a Systems Perspective-Authors: Neil H. E. Weste and Kamran Eshraghian; Addison-Wesley Publishing Company 1985.

Primary Examiner—David Hudspeth
Attorney, Agent, or Firm—Oliff & Berridge

[57] ABSTRACT

A required number of coincidence detecting circuits for the combinations of N input signals are provided, so that useless PLEs as seen in a table lookup type are eliminated. Product term lines of PLA are extended by a first extension circuit. Similarly, respective coincidence detecting outputs of coincidence detecting circuits of another PLE are connected to each other, so that coincidence signals can be output in association with M ($\geq$N) input signals. Coincidence detecting signals of further PLE are connected by a second extension circuit, whereby the number of storing of combinations of N or M input signals is extended to P sets or more, so that the number of input signals N can be set at a low value. There are added programmable selectors for making some of input signals into the coincidence detecting circuits replaceable with other input signals, so that the operating efficiency of PLE can be improved.

10 Claims, 15 Drawing Sheets

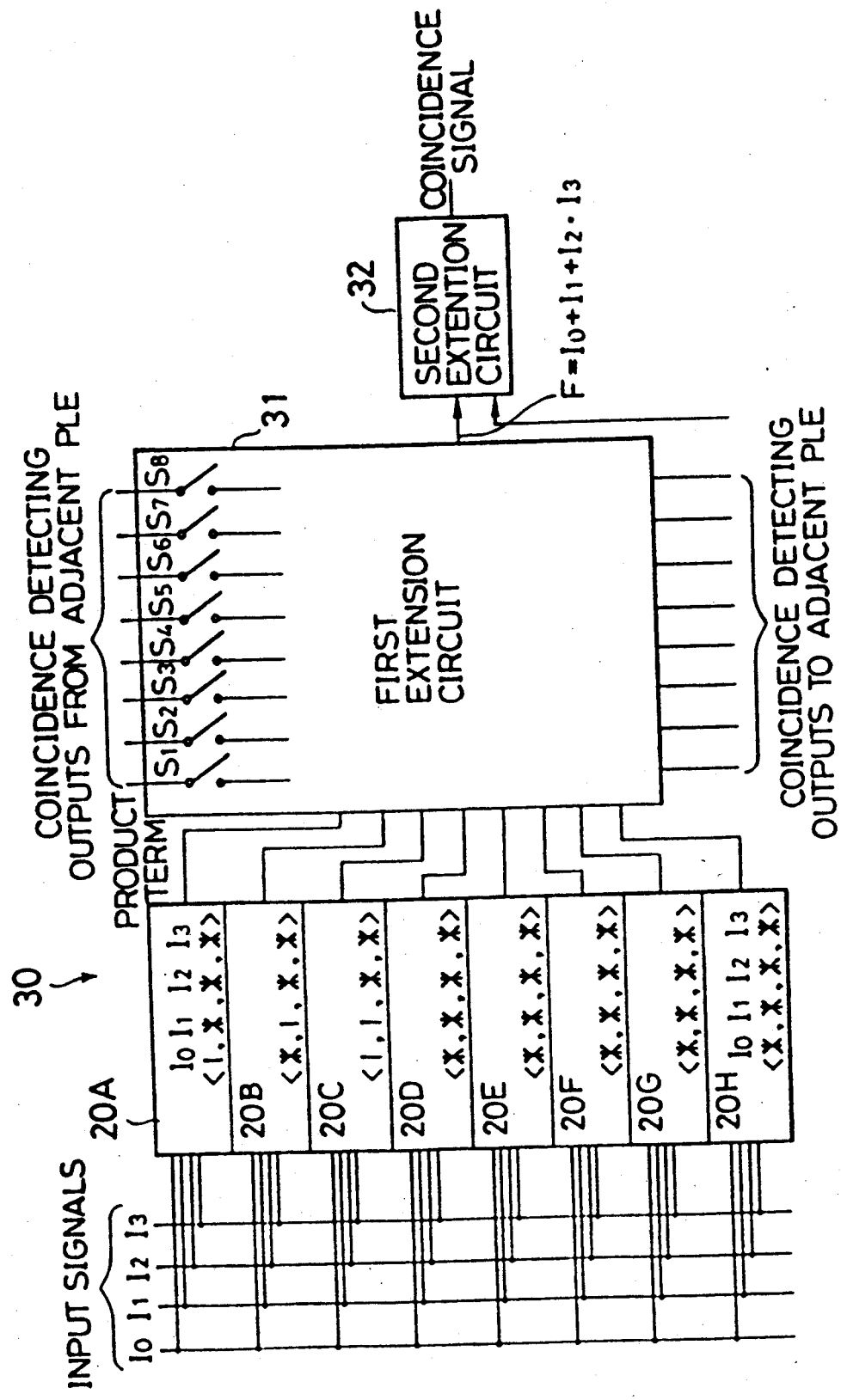

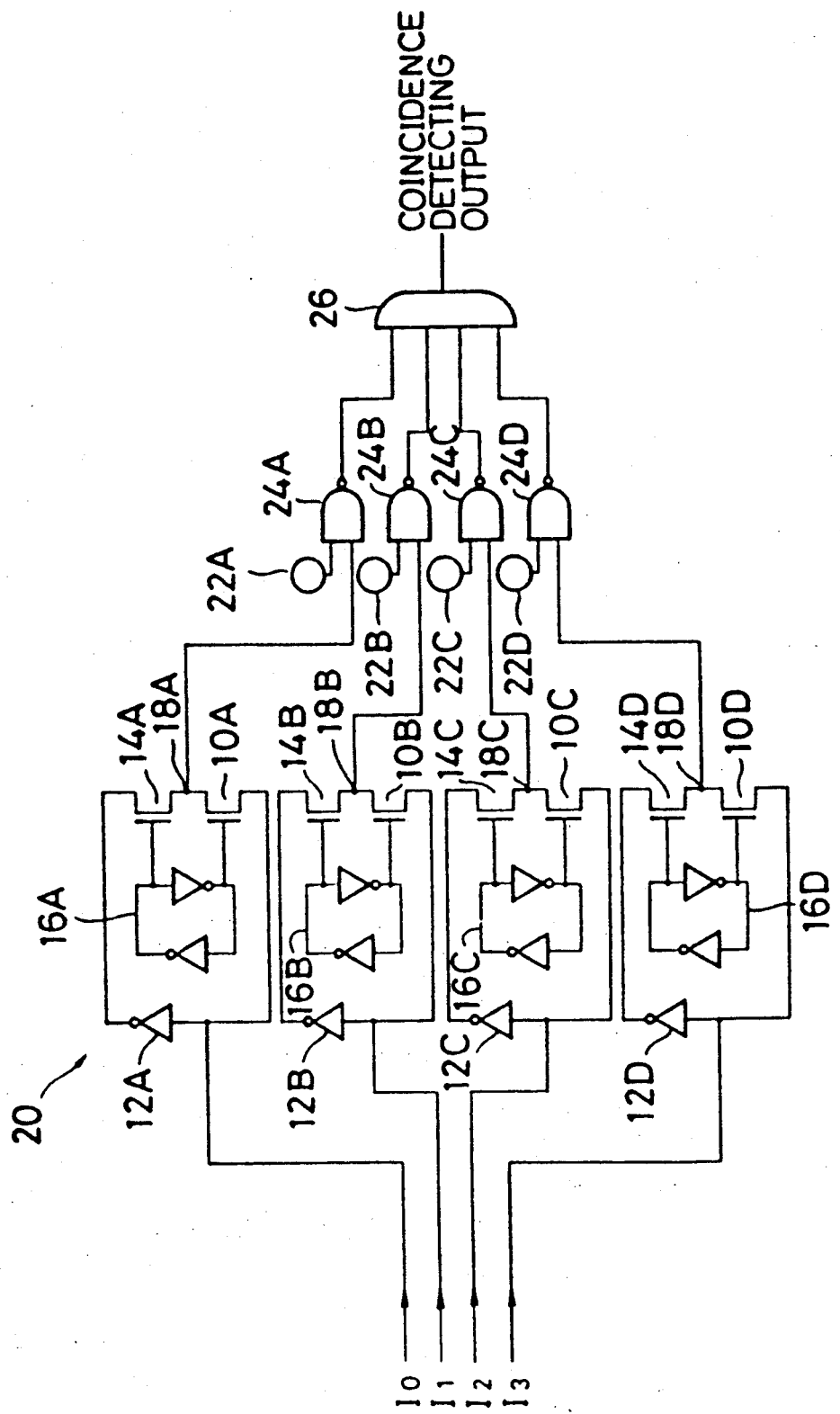

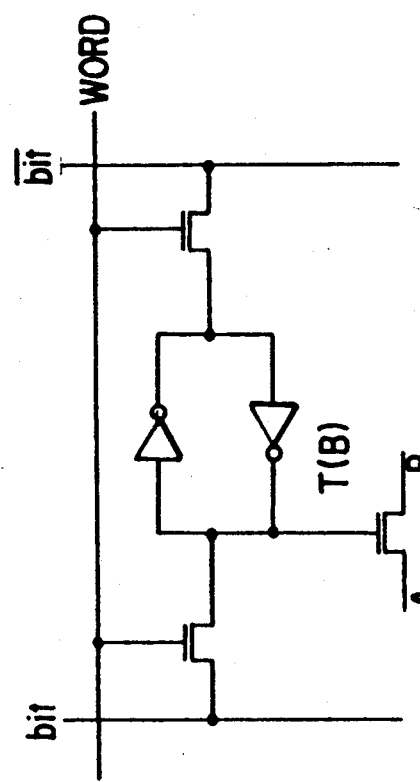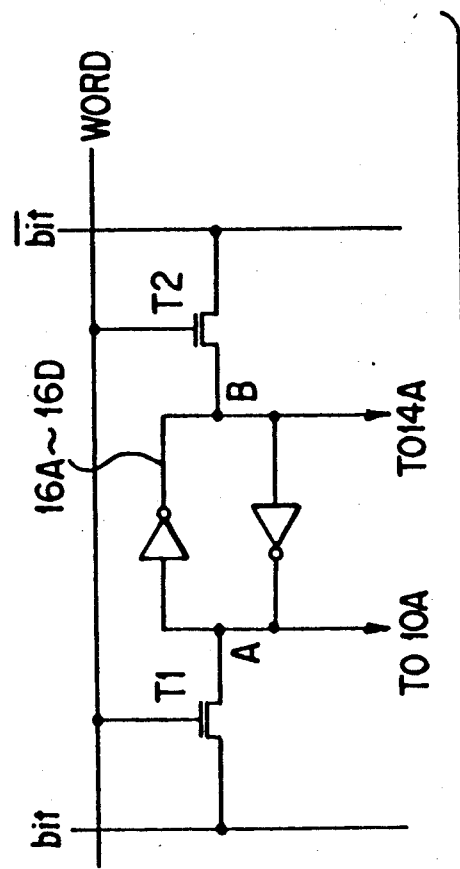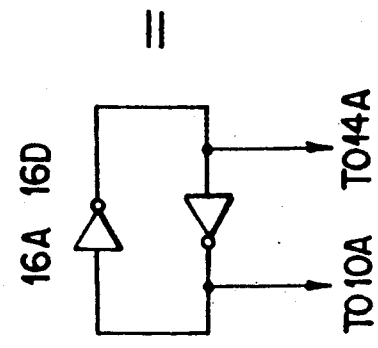

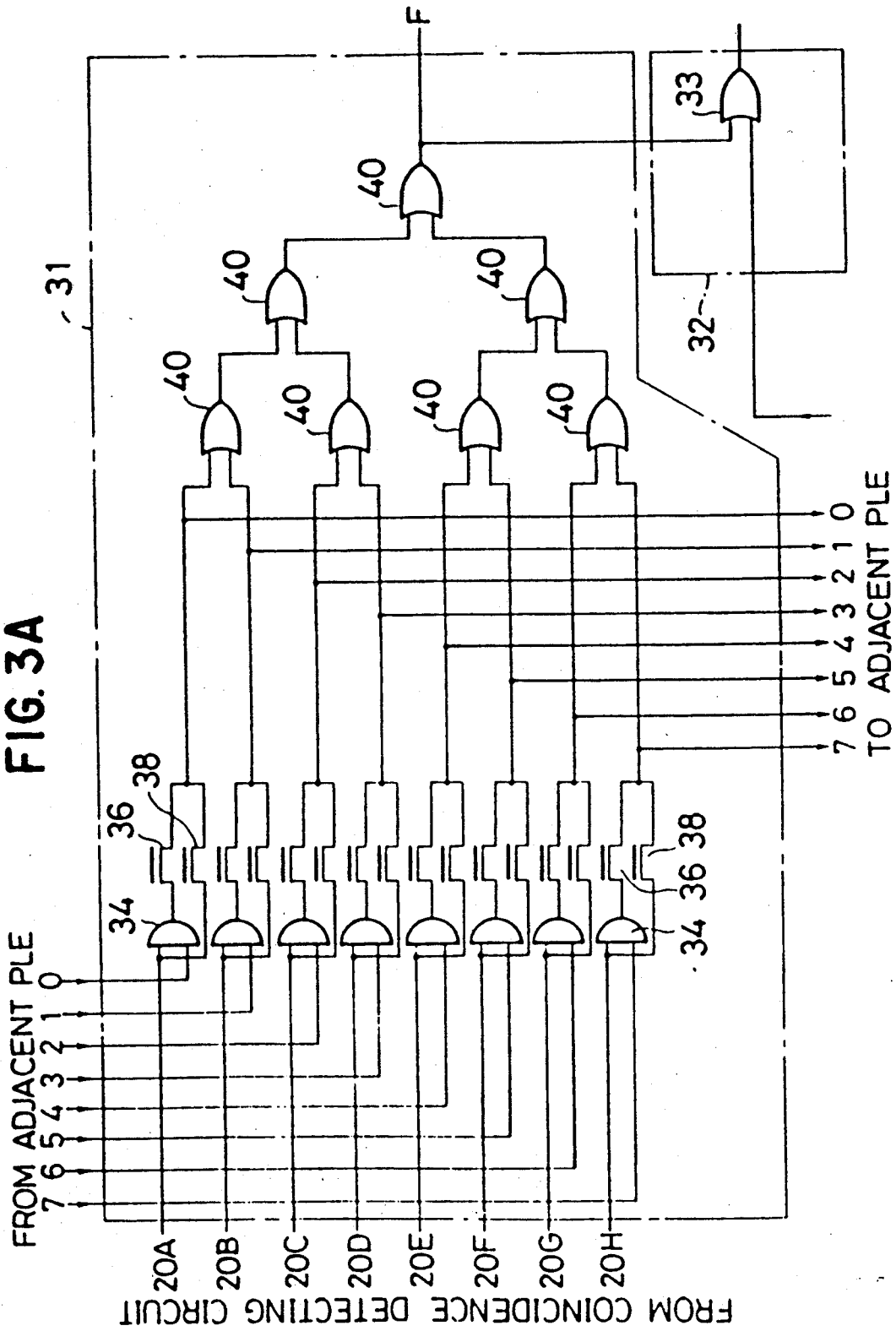

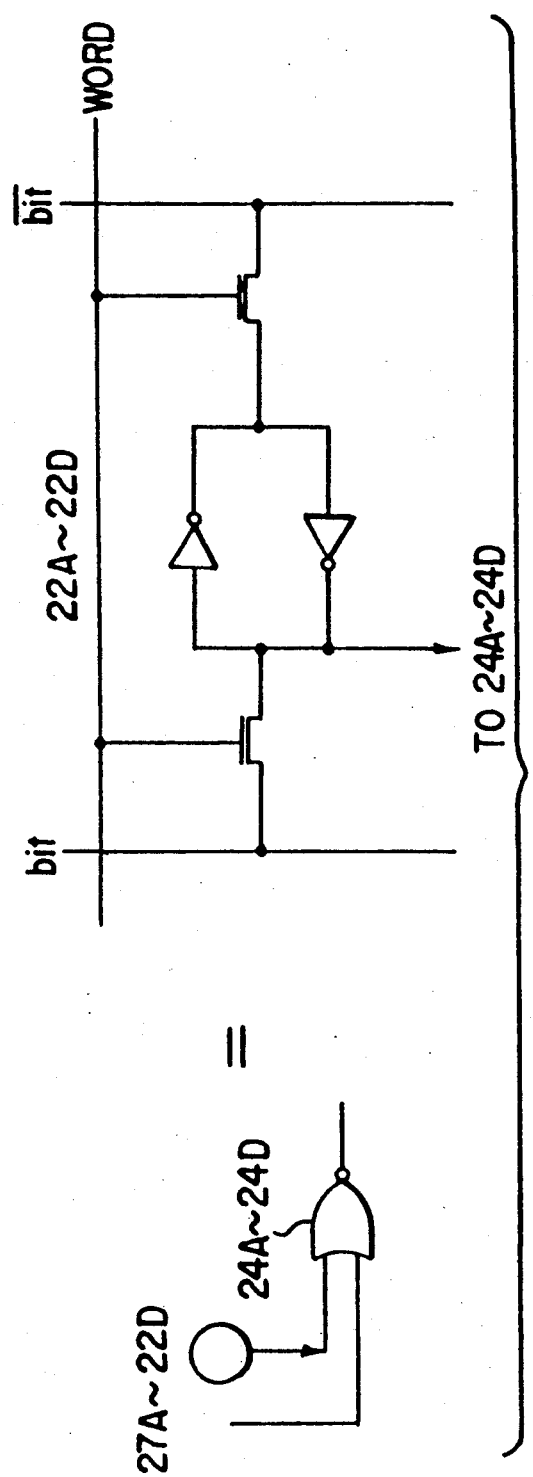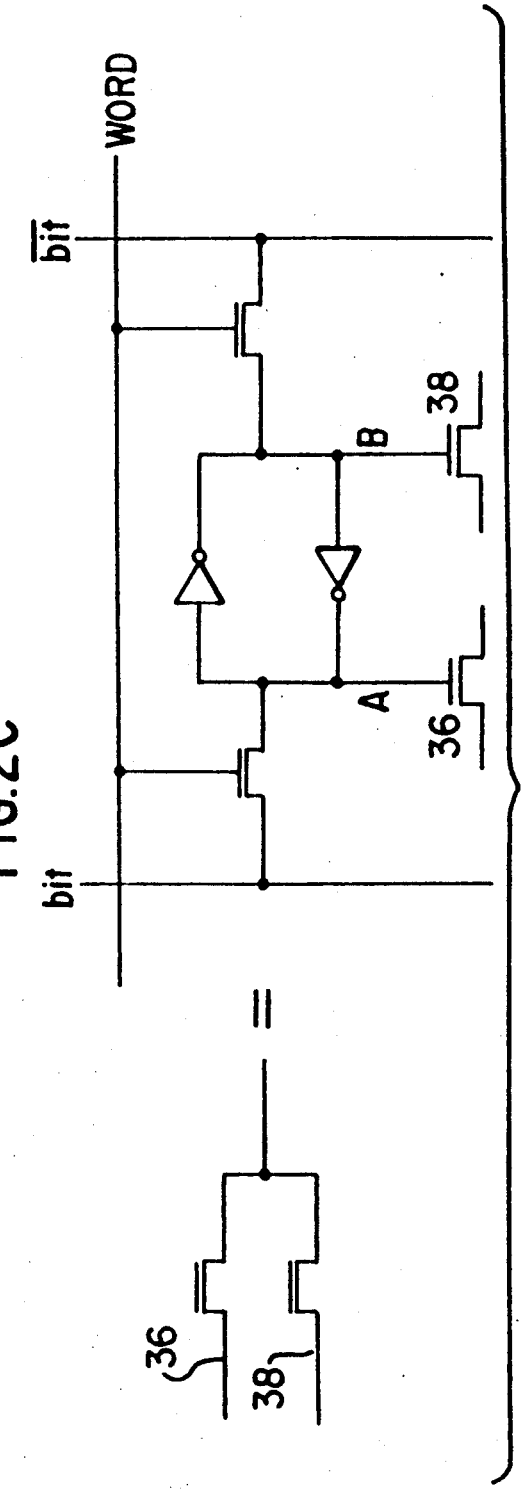
FIG. 2C
FIG. 3B

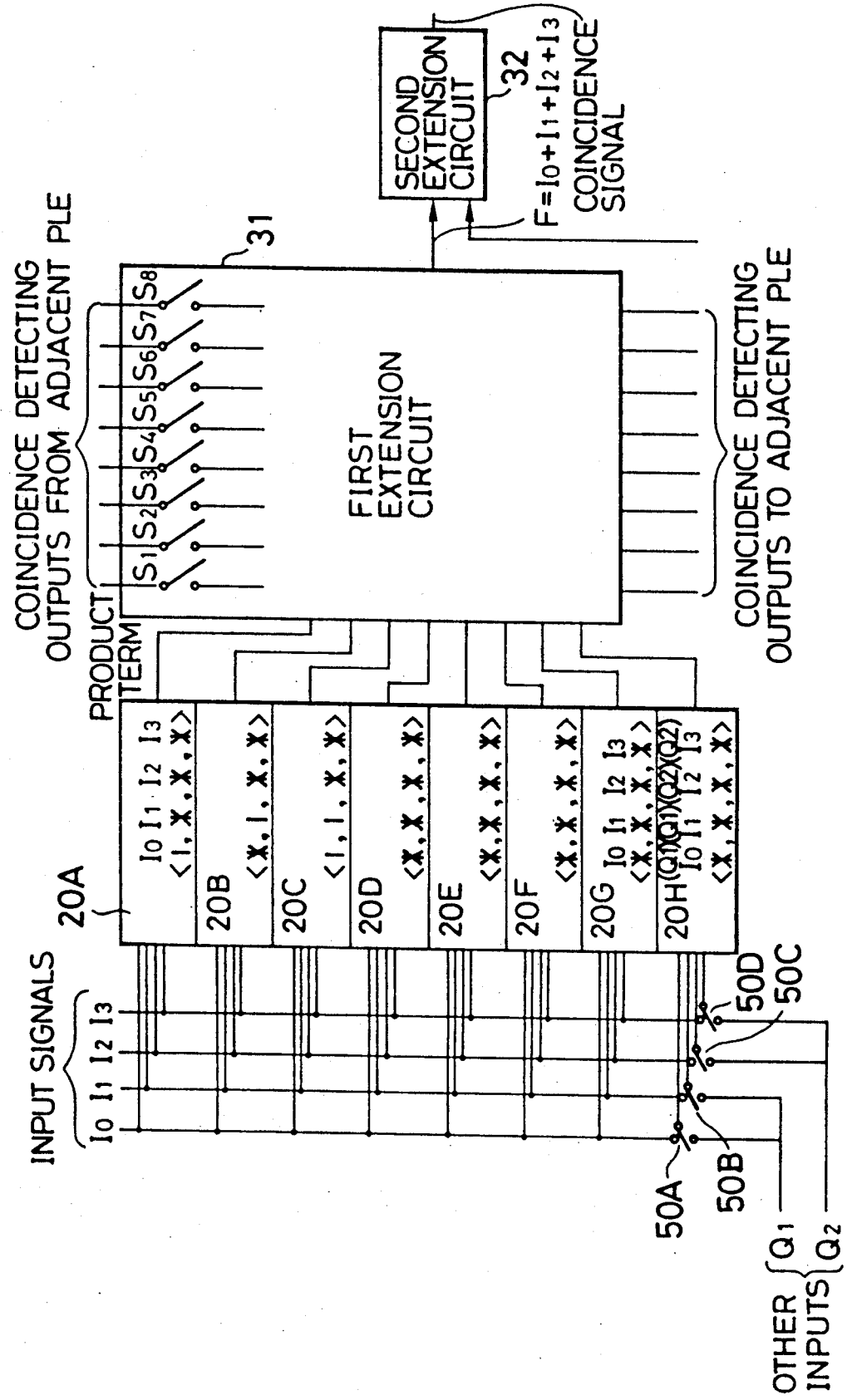

COINCIDENCE EXTENDABLE PROGRAMMABLE LOGIC DEVICE

BACKGROUND OF THE INVENTION (A) Field of the Invention

The present invention relates to a programmable logic device in which optional combinational logic circuits can be realized by user programming, and more particularly to a programmable logic device in which useless storage elements are low in number, low power consumption can be achieved without complicating the circuits, and the number of input signals can be easily extended, whereby a multiple input logic circuit can be effectively realized.

(B) Description of the Prior Art

There has heretofore been known a programmable logic device (hereinafter referred to as "PLD") in which optional logic circuits can be realized by user programming.

FIGS. 8 and 9 are block diagrams showing the PLD of this type. In this PLD, a plurality of programmable logic elements (hereinafter referred to as "PLEs") 101 are provided on a chip 100. Further, input terminals 101a and output terminals 101b of the respective PLE 101 can be desirably connected to each other by programmable wiring means 102 (Refer to FIG. 8).

The PLE 101 is arranged by a logic circuit of a type using a programmable logic array (hereinafter referred to as "PLA") having programmable AND and OR planes, a logic circuit of a table lookup type using a memory, and so forth.

According to the above-described PLD, the user can desirably select functions of the respective PLEs 101 and the wiring means 102 between the PLEs 101, so that an optional large-sized circuit can be realized.

FIG. 10 is a circuit diagram of a synchronizing type full adder arranged by CMOS PLA by use of two-phase clocks $\phi 1$ and $\phi 2$ shown in FIG. 11. Seven product term lines 104 . . . in an AND plane 103 are formed such that programmable parallel switch elements 105 and 106 as shown in FIGS. 12 and 13 are connected to each other in series. Ends on one side of the product term lines 104 are input into an OR plane 108 through inverters 107 and connected to a circuit power source VDD through p channel MOS switch elements 109 to be ON-controlled when the clock $\phi 1$ is on the low level. Ends on the other side of the product term lines 104 are connected to a grounding GND of the circuit through n channel MOS switch elements 110 to be ON-controlled when the clock $\phi 2$ is on the high level. Signals including addition inputs X and Y and a carry-in signal Cin and outputs obtained by inverting these signals by inverters 111 ON-controls the parallel switch elements 105 of the aforesaid product term lines 104 when on the high level.

As shown in FIG. 13, in the parallel switch element 106, one 106a of the switch element is ON-programmed by a SRAM (Static Random Access Memory) cell 106b irrespective of the aforesaid signals and the inverted outputs thereof. On the contrary, the parallel switch element 105 is programmed such that a SRAM cell 105b to control one 105a of the switch element is turned off as shown in FIG. 12, so that the other 105c of the switch element can be controlled.

In the aforesaid OR plane 108, n channel MOS switch elements 112 to be ON-controlled by the high level outputs of the respective inverters 107 are parallelly connected to one another. Similarly to the above, ends on one side of the switch elements 112 are connected to the circuit power source VDD through switch elements 113 and connected to respective terminals of an addition output S and a carry-out output Cout through inverters 114. Ends of the other side of the switch elements 112 are connected to the grounding GND through switch elements 115.

FIG. 14 is a circuit diagram of a non-synchronizing type full adder formed by CMOS PLA. Both the AND plane 103 and OR plane 108 in this circuit are arranged in the same manner as in the circuit of the synchronizing type full adder as shown in FIG. 10. However, the former differs from the latter in that no clock is used, ends on one side of the product term lines 104 and the OR circuit (108) are directly connected to the grounding GND of the circuit, and ends on the other side connected to the inverters 107 and 114 are pulled up to the circuit power source VDD by resistors R100, R 101, R102, R103, R104, R105, R106, R107 and R108.

However, the PLD in the above-described prior art suffers from the following problems.

(1) When a table lookup type logic circuit having an input signal number N is used as the PLE, it is difficult to extend the input signal number. If a logic circuit corresponding to inputs of the number M ($>$N) is programmed on this PLD for example, then very many PLEs are needed. Accordingly, the programmable logic circuit is subjected to many restrictions.

Needless to say the number of input signals of the above-described PLE can be set at M from the beginning. In that case, when the circuit having a small number of input signals is programmed, many unusable elements occur, so that the wastage is high.

Further, among the combinations of the input signals, there are many "Don't Care" inputs which don't affect any logic state. However, with the table lookup type logic circuit, all of the states of combinations should be stored, so that the programming efficiency is low.

(2) When the PLA is used as the PLE, useless storage elements are low in number and the product term lines can be connected to one another so that the number of input signals can be extended. However, with the non-synchronizing type PLA shown in FIG. 14, pull-up resistors R100–R108 are necessarily required, and it is difficult to lower the power consumption because of through currents between the circuit power source VDD→ the grounding GND. Accordingly, from the viewpoint of the circuit scale, the scale cannot be made larger than a certain extent.

If a synchronizing type PLA as shown in FIG. 10 is used as a solution, the two-phase clocks $\phi 1$ and $\phi 2$ should be used, whereby it becomes difficult for the user to handle. Further, due to the use of these clocks, it becomes necessary to provide a multiplicity of switch elements 109 and 110 for ON/OFF controlling the circuit, thereby presenting the problem of complicating the circuit.

If the technique of ATD (Address Transition Detection) is used, then DC power consumption can be reduced. However, in this case, difficulty is encountered in using the PLA in a larged-scaled PLD, because a complicated circuit is required.

Then, recently, there has been adopted a table lookup type logic circuit capable of being perfect CMOS arrangement in the large-scaled PLD.

In the large-scaled PLD, setting of the number of logic function inputs of the PLE serves as an important key to determine the degree of freedom of the PLD. That is, the more the number of inputs is, the easier the user can program optional circuit. However, when many inputs are set, it leads to an increase in a chip area of the PLD. Accordingly, it is desirable to adopt such a circuit arrangement that, first, the number of inputs into the PLE is set at a relatively low value, and, when the number of inputs into the circuit to be programmed by the user is large, the number of inputs may be easily increased.

However, with the table lookup type PLD, as shown in FIG. 15 for example, when the number of inputs is set at N (N=4 in an example shown in FIG. 15), memory 120 of $2^N$ bits (in the example shown in FIG. 15, 16 bit RAM) are required. In a case of 8 inputs, a RAM of 256 bits is required. In FIG. 15, designated at 121 is an X-decoder for decoding input signals I1 and I2, and 122 a Y-decoder for decoding input signals I3 and I4.

In consequence, it is very difficult to cope with a multiplicity of inputs, and, in order to program logic functions having more logic signal inputs than the inputs into the PLE, it is necessary to connect a plurality of PLEs in series.

FIG. 16 shows an example in which a logic circuit having 24 inputs and 8 product term lines as shown is arranged by use of PLEs 130 for 4 inputs. However, in this example, since the extension is difficult, the interior of each broken line frame as shown should be supplied by one PLE, so that 11 PLEs are required in total. Furthermore, there have been presented the problems that, to connect a plurality of PLEs in series, the operating speed becomes slow and so on.

SUMMARY OF THE INVENTION

The present invention has been developed to obviate the above-described disadvantages of the prior art and has as its object the provision of a PLD, in which the number of useless storage elements is decreased, low power consumption can be achieved without complicating the circuit, the extension of the number of input signals is easily carried out, and a logic circuit having a multiple inputs can be efficiently realized, so that a large-sized PLD being at high operating speed and having a high degree of freedom and low power consumption can be realized.

To achieve the above-described object, the present invention contemplates in a PLD, in which a plurality of PLEs are provided and the PLEs are optionally connectable to one another, having a plurality of PLEs each provided with coincidence detecting means, a first extension means and a second extension means, said coincidence detecting means comprises P sets of means for storing combinations of N input signals and generating a coincidence detecting output when the combinations of N input signals coincide with the stored combinations, said first extension means enables PLEs to store P sets of combinations of M input signals more than N by connecting coincidence detecting outputs from another PLE to the coincidence detecting outputs of the coincidence detecting means of the P sets and has a function of extending to a combinational logic circuit for generating a coincidence signal when the combination of M input signals coincides with the combination of M input signals stored in P sets, and further, said second extension means has a function of extending to a combinational logic circuit storing the combinations of N or M input signals more than P sets by connecting coincidence signals from another PLE to the coincidence signals generated from the first extension means.

According to the present invention, further, there are added programmable selectors capable of replacing at least some of the input signals into the coincidence detecting means of the aforesaid PLE with other input signals, so that the operating efficiency of the PLE can be further improved.

To achieve the above-described object, the present invention contemplates in a PLD, in which a optional combinational logic circuit can be realized, comprising a programmable logic function generating means including: a first transfer gate group, into which the positive logics of a plurality of input signals are input; a second transfer gate group, into which the negative logics of the aforesaid input signals are input; a programmable storage element group for generating signals to turn on either one of the aforesaid first and second transfer gates and to turn off the other in response to an input signal corresponding thereto; and wirings for connecting output terminals of the aforesaid first and second transfer gates to each other.

As an example shown in FIG. 1A, in the PLD according to the present invention, there is provided a required number (P) of the coincidence detecting means (20A-20H) having the combination of N input signals (I0-I3), the useless programmable devices as seen in the table lookup type PLD are eliminated. Further, in the same manner as the product term lines of the PLA is extended by the first extension means (31), respective coincidence detecting outputs from coincidence detecting means of another PLE similar to the present invention are connected to each other, so that coincidence signals corresponding to M ($\geq$ N) input signals can be output. Further, by the second extension means (32), coincidence detecting signals of the other PLE similar to the present invention are connected to each other, whereby the number of storage of the combinations of N or M input signals is extended to more than P sets, so that the number of input signals N can be decreased. Furthermore, output signals from other general PLEs can be connected to this second extension means (32).

A plurality of PLEs with the above-described arrangement is provided, whereby both the combinational logic of inputs small in number and the combinational logic of inputs large in number can be efficiently coped with, so that a scale of a circuit programmed on a chip can be substantially increased. Furthermore, since the product term lines of the PLA and the like are not used, necessity of pull-up resistors is eliminated, so that low power consumption can be realized. Further, the non-synchronizing type circuit arrangement can be adopted, so that two-phase clocks as in the synchronizing type circuit arrangement are not required and the circuit can avoid being complicated.

Further, as exemplified in FIG. 6, the PLD according to the present invention is added thereto with the programmable selectors 50A-50D capable of replacing at least some of the input signals into the coincidence detecting means (20A-20H) of the aforesaid PLE with other input signals, whereby signals Q1 and Q2 other than the aforesaid input signals I0-I3 can be input into the coincidence detecting means. With these selectors, PLE sometimes can be improved in its operating efficiency.

Furthermore, as exemplified in FIG. 2A, the PLD according to the present invention comprises the programmable logic function generating means (20) including: a first transfer gate group 10A-10D, into which the positive logics of the plurality of input signals I0-I3 are input; a second transfer gate group 14A-14D, into which the negative logics of the aforesaid input signals I0-I3 are input through inverters 12A-12D for example; a programmable storage element group formed of SRAM cells 16A-16D for example, for generating signals to turn on the aforesaid first or second transfer gate and to turn off the other in response to an input signal corresponding thereto; and wirings 18A-18D for connecting the output terminals of the aforesaid first and second transfer gates to each other.

In FIG. 2A, the SRAM cell 16A-16D are shown in schematic form. In actuality, as shown in FIG. 2B, for example, each SRAM cell comprises a pair of inverters having mutually connected input and output terminals A and B, respectively, and transfer gates T1 and T2 inserted between the respective output terminal A, B and bit line (bit, $\overline{\text{bit}}$) for writing data. Gates of the transfer gates T1, T2 are connected to a word line (WORD) for controlling the writing.

In this programmable logic function generating means, the respective input signals I0-I3 are inverted by the inverters 12A-12D, the signals thus inverted and the original input signals I0-I3 are selected by selectors formed of the sets (10A, 14A), (10B, 14B), (10C, 14C) and (10D, 14D) of the first and second transfer gates, and output through the wirings 18A-18D. Either one of the respective sets of the two transfer gates which constitute the selectors are turned on and the other are turned off by the SRAM cells 16A-16D.

The PLD including the above-described programmable logic function generating means does not require to use the pull-up resistors, and therefore is of low power consumption type. As will be described hereunder, the number of inputs can be easily extended. Therefore, the large-scaled PLD being at high operating speed, having the high degree of freedom and the low power consumption can be realized.

BRIEF DESCRIPTION OF THE DRAWINGS

The exact nature of this invention, as well as other objects and advantages thereof, will be readily apparent from consideration of the following specification relating to the accompanying drawings, in which like reference characters designate the same or similar parts throughout the figures thereof and wherein:

FIG. 1A is a circuit diagram showing the arrangement of a first embodiment of PLEs constituting the PLD according to the present invention;

FIG. 1B shows an equivalent circuit of switches S1-S8 depicted schematically in FIG. 1A.

FIG. 2A is a circuit diagram showing the arrangement of a coincidence detecting circuit used in the above PLE;

FIGS 2B and 3C show equivalent circuits for SRAM cells depicted schematically in FIG. 2A.

FIG. 3A is a circuit diagram showing examples of arrangements of a first and a second extension circuits which are used in the above PLE;

FIG. 3B shows an equivalent circuit for switches 36, 38 depicted schematically in FIG. 3A.

FIG. 6 is a circuit diagram showing the arrangement of a second embodiment of the PLEs constituting the PLD according to the present invention;

DESCRIPTION OF THE BEST MODES

Figure 4:
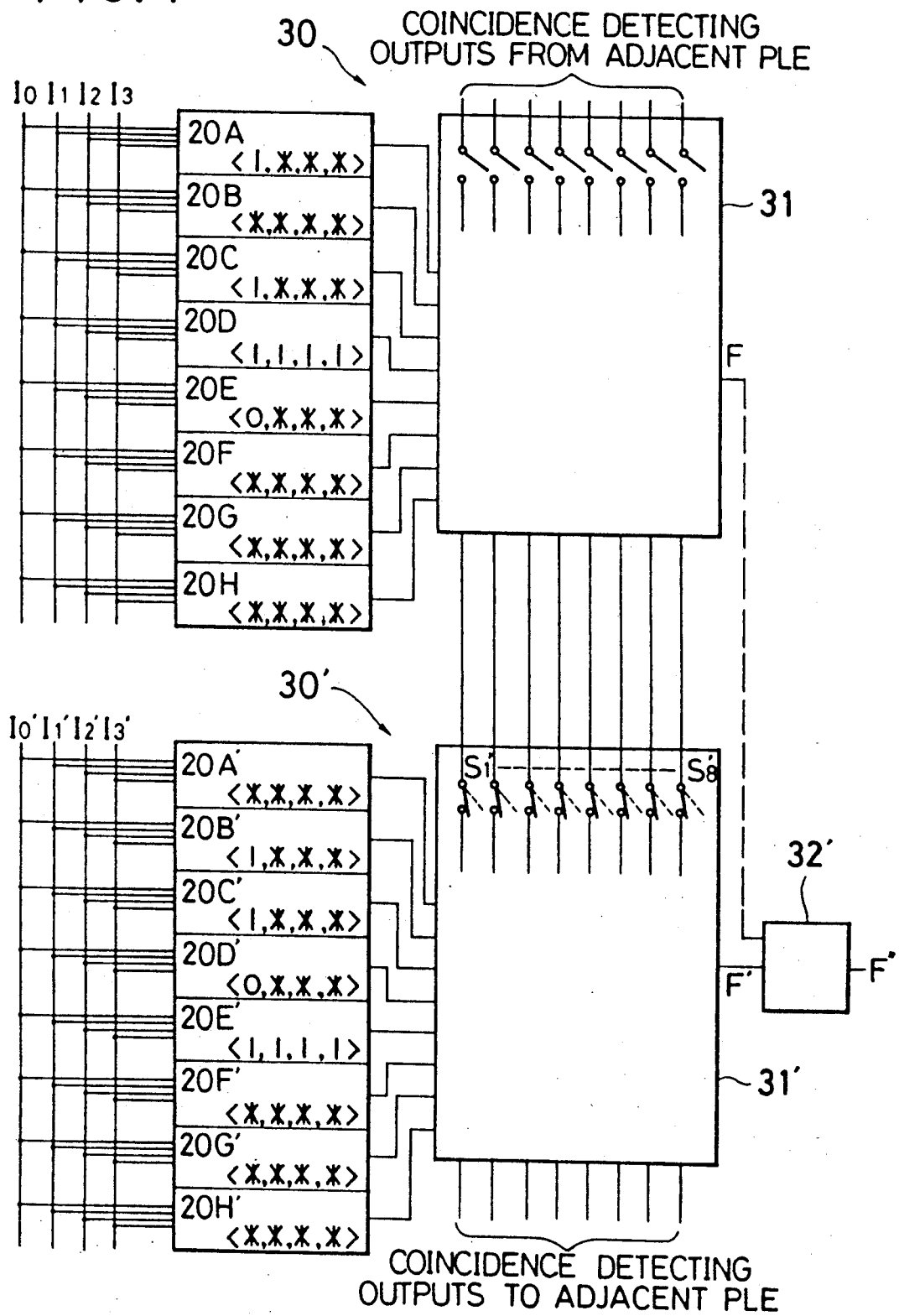
FIG. 4 is a block diagram in explanation of action of the first embodiment.

The embodiment of the present invention will hereunder be described in detail with reference to the accompanying drawings.

FIG. 1A is the block diagram showing the first embodiment of the present invention. This first embodiment shows the example of arrangement of one PLE 30 adopted to store 8 sets of the combinations of N=4 input signals.

This PLE 30 includes 8 coincidence detecting circuits 20A-20H (P=8), terminals for receiving four input signals I0-I3, a first extension circuit 31 and a second extension circuit 32. The four input signals I0-I3 are parallelly connected to inputs of the respective coincidence detecting circuits 20A-20H.

Each of the coincidence detecting circuits 20A-20H has a function of storing one set of the input signal combination shown as in < > and delivering a coincidence detecting output to the first extension circuit 31 when the actual input signals I0-I3 coincide with the stored combination.

The first extension circuit 31 has a function of connecting the coincidence detecting outputs from the respective coincidence detecting circuits 20A-20H to respective 8 coincidence detecting outputs from an adjoining PLE to take logical products and outputting a total logical sum of these logical products to the second extension circuit 32 as a coincidence signal F. Accordingly, when the adjoining PLE has number of input signals N=4 for example, the first extension circuit 31 can store the combinations of input signals M=8 including this number of input signals N=4 and process simultaneously.

The coincidence detecting outputs input into the first extension circuit 31 from the adjoining PLE are input through programmable switch elements S1-S8, so that selection can be performed as to whether these coincidence detecting outputs are individually extended or not.

In FIG. 1A, the programmable switch elements S1-S8 are shown in schematic form. In actuality, as shown in FIG. 1B, for example, each switch can be constructed by use of a SRAM cell. Each SRAM cell has signal lines (bit, bit, WORD) for writing from the outside. In case extension means are utilized, "1" is written to the SRAM cell, and a transfer gate T(B) is made on. In case extension means is not utilized, "0" is written in the SRAM cell. This writing operation is conducted only when a user programs the PLD for circuit configuration, and the condition is fixed after the desired circuit is obtained (programmed).

Furthermore, in order to be further extendable, the respective logical products as described above are output to output terminals to be connected to the other adjoining PLE.

The second extension circuit 32 has a function of taking a logical sum between the coincidence signal F delivered from the first extension circuit 31 and a coincidence signal from another PLE. Accordingly, for example, it becomes possible to store and process the combinations of input signals having M=8 more than P=8 sets. Connection of the coincidence signal from another PLE as aforesaid may be carried out by use of a programmable wiring means, not shown.

FIG. 2A is the circuit diagram showing the embodiment of a coincidence detecting circuit 20 as being a programmable logic function generating means according to the present invention. The respective input signals I0–I3 are inverted by the inverters 12A, 12B, 12C and 12D, the signals, e.g., true, thus inverted and the respective original input signals I0–I3, e.g., true, are selected by the selectors constituted by a set 10A and 14A, a set 10B and 14B, a set 10C, and 14C, a set 10D and 14D of pass transistors, and connected to inputs on one side of two input NAND gates 24A, 24B, 24C and 24D. Either one of the respective sets of the two pass transistors constituting the selectors is turned on by the programmable storage elements such as the SRAM cells 16A, 16B, 16C and 16D.

More specifically, by applying "high" voltage to the WORD line in FIG. 2B, data "1" or "0" fed from the outside through the bit or bit line, can be written in the respective SRAM cell 16A–16D. According to the written information, the respective SRAM cell 16A–16D controls ON/OFF conditions of pass transistors (selectors) 10A–10D and 14A–14D, respectively. After writing the information, the WORD line is kept at a "low" voltage to store (hold) the written information in the SRAM cells 16A–16D. This writing operation is conducted only when a user programs the PLD to obtain a desired circuit, and the condition is fixed after the desired circuit is obtained (programmed).

The respective NAND gates 24A–24D are ones for setting "Don't Care" inputs which don't care any logic state, and connected to other inputs of the NAND gates 24A–24D are outputs of SRAM cells (programmable storage elements) 22A, 22B, 22C and 22D for example. In FIG. 2A, the SRAM cells 22A–22D are shown in schematic form. In actuality, as shown in FIG. 2C for example, each SRAM cell can be constructed so as to utilize only one output terminal A of a SRAM cell similar to that shown in FIG. 2B. This SRAM cell is also written only in initial programming. When outputs of these SRAM cells 22A–22D are set on the low level, outputs of there NAND gates 24A–24D come to be on the high level regardless of the input level from the aforesaid selectors, and can serve as the "Don't Care" inputs. On the other hand, for the outputs of the NAND gates 24A–24D for detecting the coincidence, the outputs of the aforesaid SRAM cells 22A–22D are set on the high level.

The outputs from the respective NAND gates 24A–24D are input into a four input AND gate 26. When an input selected by the selector is set on the low level, a NAND gate corresponding thereto comes to be on the high level. In this way or by setting the aforesaid "Don't Care" input, when all of the NAND gates 24A–24D come to be on the high level, the high level is delivered to the output of the AND gate 26 as a coincidence detecting output. Accordingly, the aforesaid SRAM cells 16A–16D should store the combination of four input signals.

The coincidence detecting circuit 20 thus constructed utilizes a well-known function as a CAM (Content Addressable Memory). Namely, one of 16 combinations of I0–I3 is previously programmed in each SRAM cell (programmable storage element) 16A–16D. When the actual combination of input signals I0–I3 coincides with the stored contents of SRAM cells 16A–16D, the AND gate 26 outputs "1". The logical AND output of the AND gate 26, which is a coincidence detecting signal of the input signals I0–I3, is inputted to the next stage as shown in FIG. 3A and logical OR with the other coincidence detecting signal is taken. Therefore, the coincidence detecting circuit can be used as a combinational logic generating means by use of AND and OR.

FIG. 3A is the circuit diagram showing the examples of the arrangements of the first extension circuit 31 has and the second extension circuit 32. The first extension circuit 31 has 8 two input AND gates 34, connected to inputs on one side thereof are the coincidence detecting outputs from the aforesaid coincidence detecting circuit 20A–20H, and connected to inputs on the other side thereof are the 8 coincidence detecting outputs from the adjoining PLE.

An output from one AND gate 34 and the coincidence detecting output from each of the coincidence detecting circuit 20A–20H to input therein are connected to each other through programmable switch elements 36 and 38 each of which constitutes a selector, and formed into a coincidence detecting output for the extension of the adjoining other PLE or for producing a coincidence signal.

In FIG. 3A, the programmable switch elements 36, 38 are shown in schematic form. In actuality, as shown in FIG. 3B for example each switch element can be constructed by use of SRAM cells shown in FIGS. 2B and 2C. Output terminals A, B of the SRAM cell are connected to gates (the programmable switch elements) 36, 38. The switch elements 36, 38 form a selector. Therefore, the switch elements can be controlled by 1 bit information when complementary outputs A, B of the SRAM cell are inputted to the gates of the transfer gates, respectively. This SRAM cell is also written only in initial programming for the circuit configuration, and the condition is fixed thereafter.

The aforesaid switch elements 36 are ones corresponding to the switch elements S1–S8 of FIG. 1. Incidentally, such an arrangement may be adopted that an input from the adjoining PLE is ON/OFF controlled and a selector is provided for giving the high level to the AND gates 34 instead at the time of OFF. In this case, outputs from the AND gates 34 come to be coincidence detecting outputs.

OR gates 40 each constitute a circuit for taking the total logical sum F of the aforesaid coincidence detecting outputs. When the combination of the actual input signals coincide with any one of the previously stored 8 sets of the combinations, this total logical sum F comes to be coincidence signal. Thus, the product term number is set at 8, so that all of the four input combinational logic circuits can be realized.

A two input OR gate 33 is an example of the aforesaid second extension circuit 32, and arranged such that the aforesaid coincidence signal F is connected to one of inputs thereof and the coincidence signal of another PLE can be connected to the other of inputs thereof through a programmable wiring means, not shown, so that the number of the coincidence detecting circuits can be extended.

Figure 8:
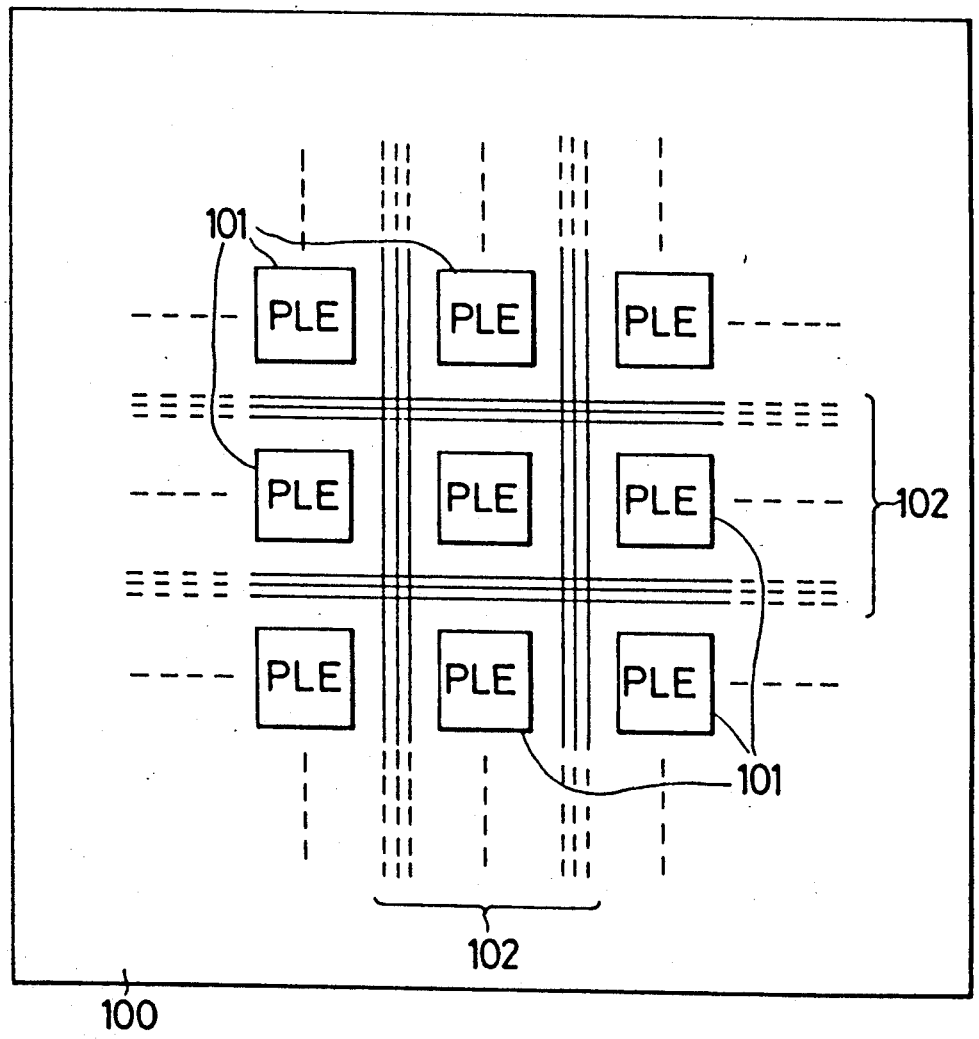
FIGS. 8 and 9 are charts showing examples of the large-scaled PLDs in which a multiplicity of PLEs are arranged.
Figure 9:
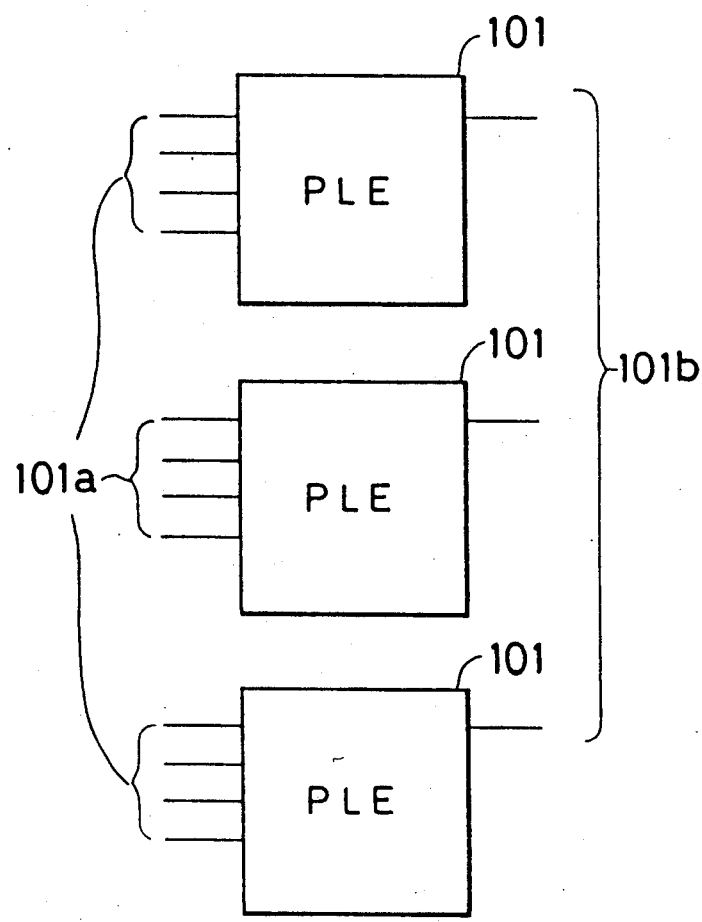
Figure 11:
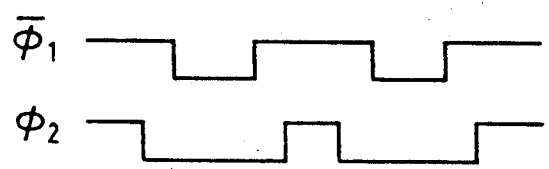
FIG. 11 is a chart showing two-phase clocks used in the example of FIG. 10.
Figure 10:
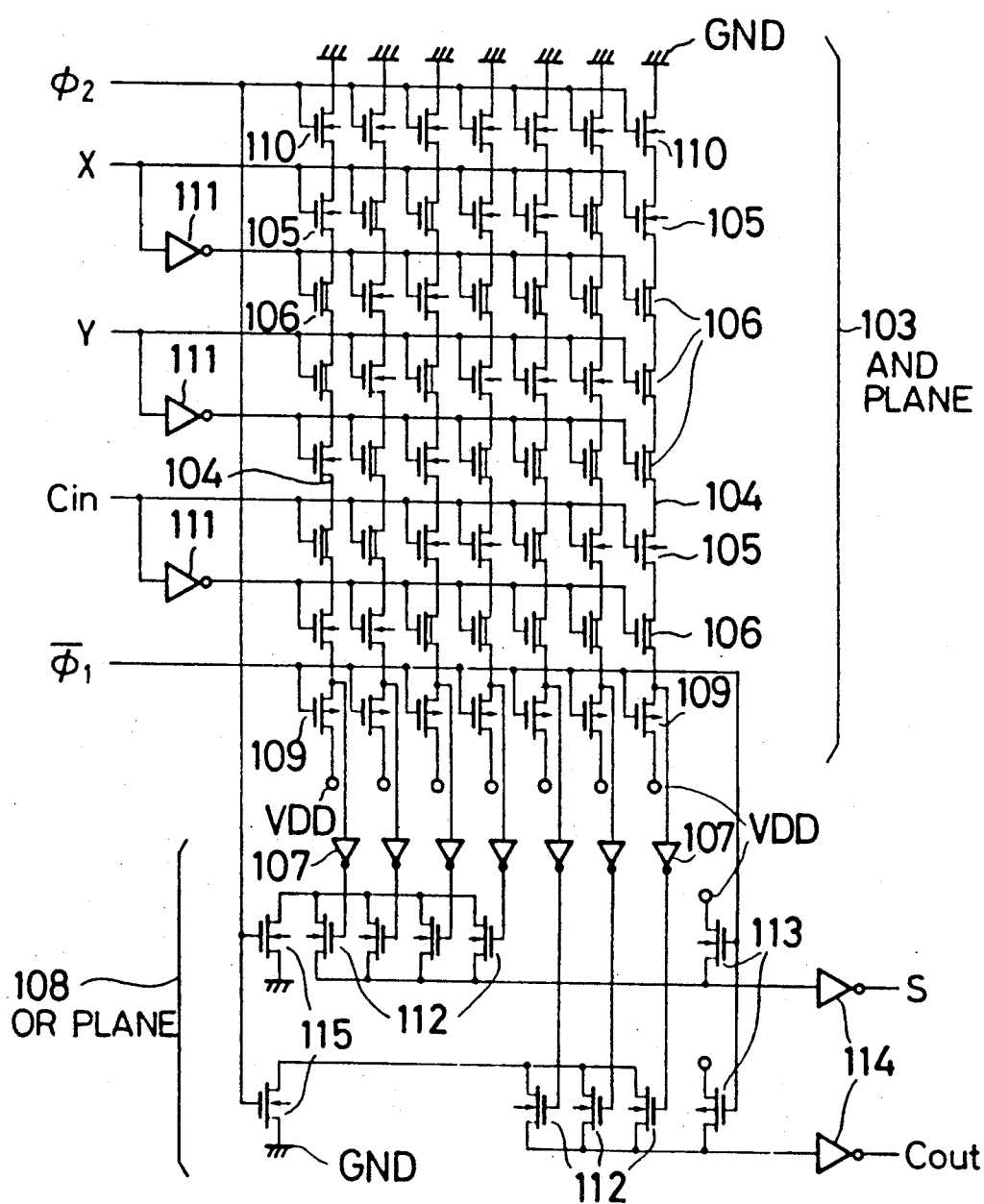
FIG. 10 is a circuit diagram showing an example of a synchronizing type full adder constituted by the conventional PLA.
Figure 12:
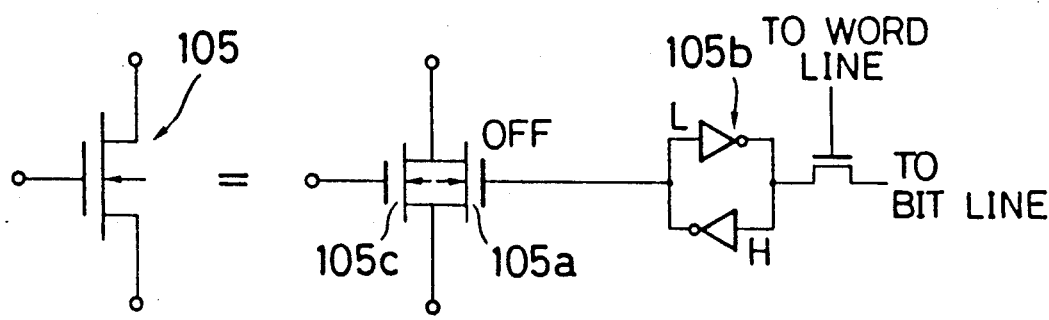
FIGS. 12 and 13 are circuit diagrams showing the arrangements of programmable parallel switch elements used in the example of FIG. 10.
Figure 13:
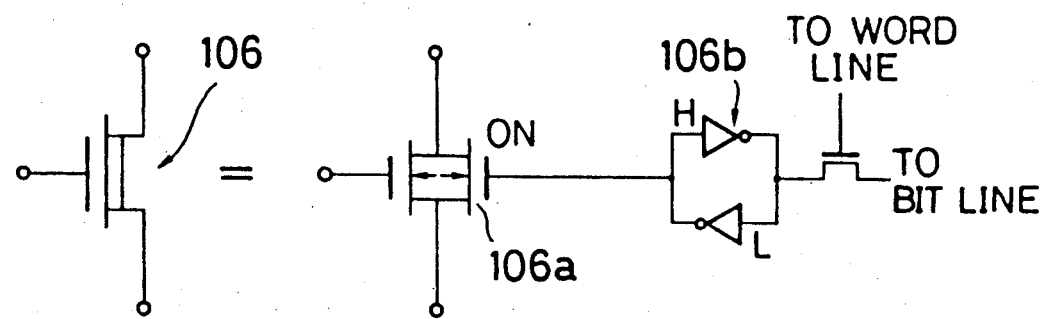
Figure 14:
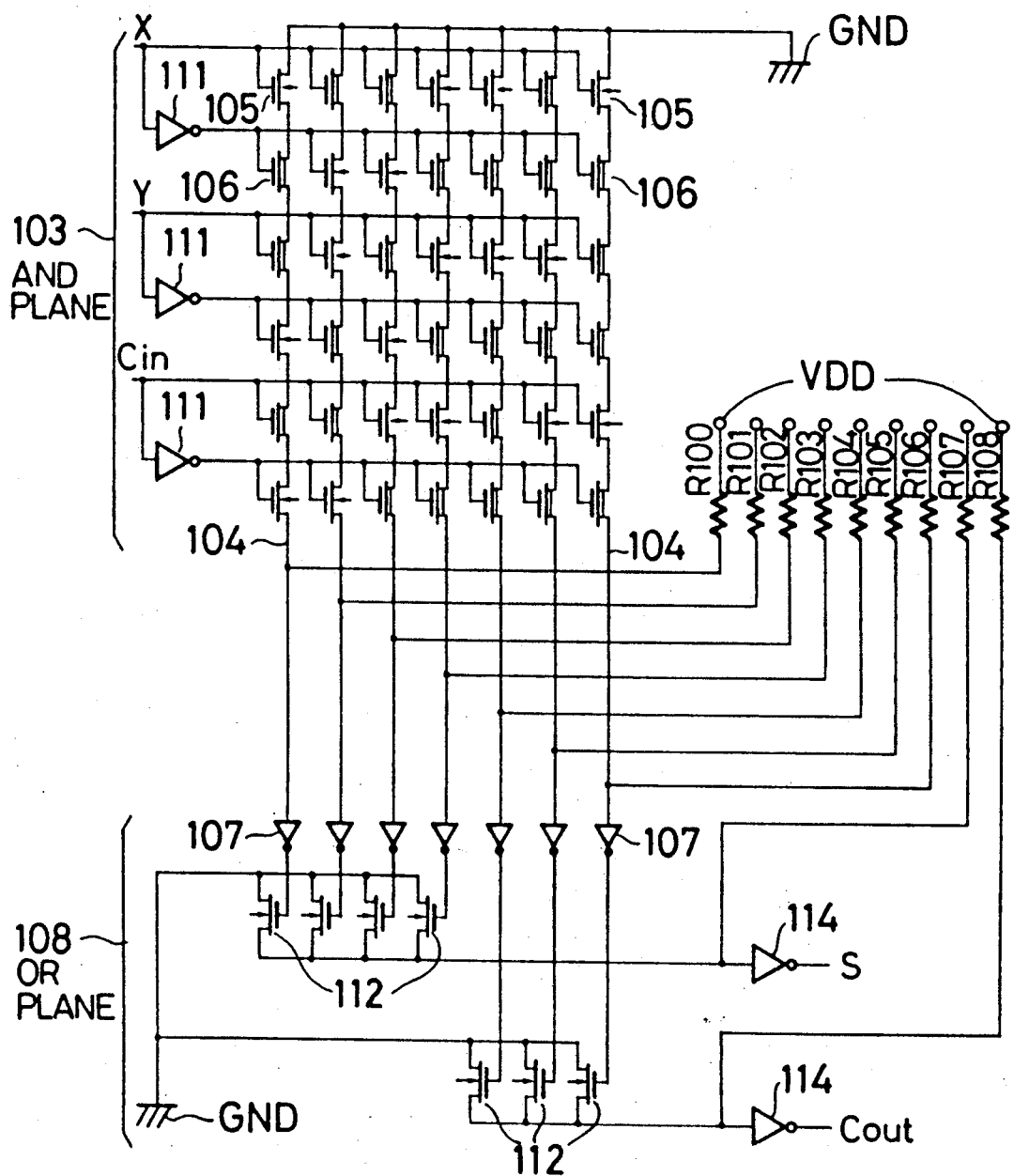
FIG. 14 is a circuit diagram showing an example of the non-synchronizing type full adder constituted by the conventional PLA.
Figure 15:
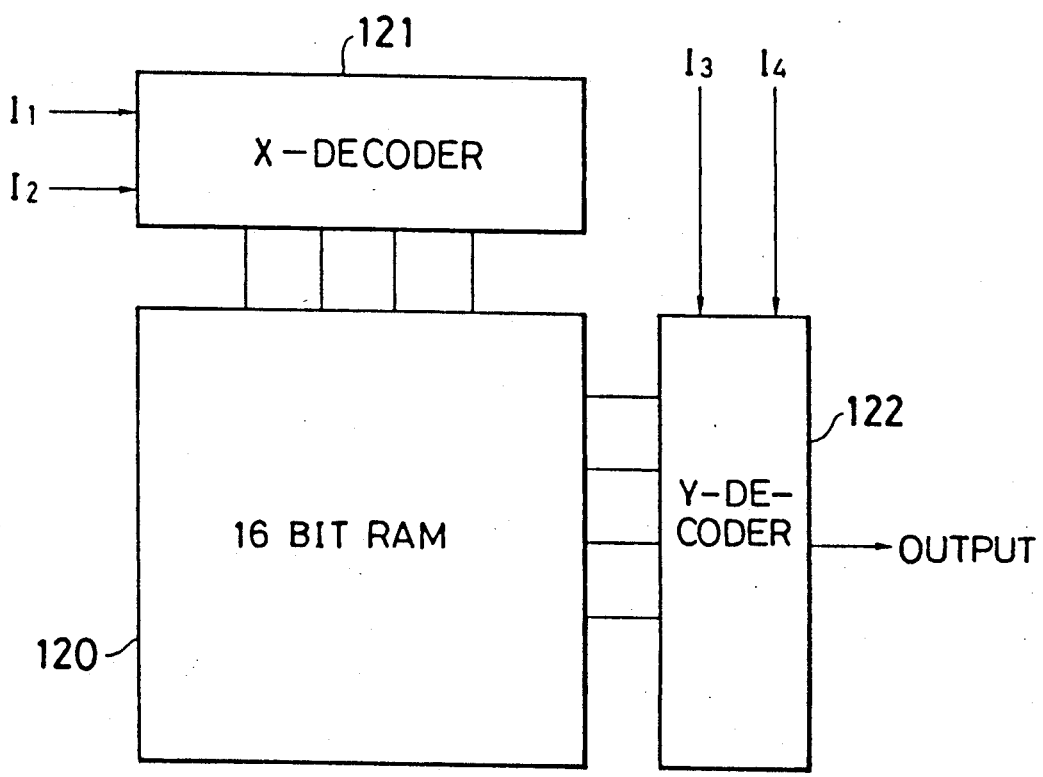
FIG. 15 is a block diagram showing an example of a programmable logic function generating section according to the table lookup type.

The PLE thus arranged is a programmable combinational logic circuit (hereinafter referred to as "PCL") and can be incorporated in the PLD shown in FIGS. 8 and 9 as a logic element.

Action of the first embodiment with the above-described arrangement will hereunder be described. FIG. 4 is the explanatory view of the action of the first embodiment, showing a case in which the combinational logic of 8 sets of 8 inputs or 16 sets of 4 input are realized by use of the arrangement of FIG. 1A.

In this circuit, the 8 coincidence detecting outputs of the first extension circuit 31 of one of the PLEs 30 are connected to a first extension circuit 31' of another PLE 30', a logical product between the coincidence outputs of the coincidence detecting circuits corresponding to each other is taken as in the case between the circuits 20A and 20A' for example, and 8 sets of combinations for the 8 input signals of I0–I3 and I0'–I3' are stored, so that the extension can be made to detect the coincidence. Here, for example, when it is desired to realize the following combinational logic F', the combinations shown as in < > are set in the respective coincidence detecting circuits 20A–20H and 20A'–20H' and then the high level should be delivered as the coincidence detecting output.

$$F = I_0 + I_0' + I_0 I_0' + I_0 I_1 I_2 I_3 \overline{I_0'} + \overline{I_0} I_0' I_1' I_2' I_3' \quad (1)$$

Marks * in the drawings indicate setting of "Don't Care" inputs.

In general, when the above-described extension is carried out by use of the same PLE capable of storing P sets of combinations of N input signals, P sets of N×Q (Q=2, 3 . . . ) input signals can be stored. Needless to say, PLEs having different numbers of input signals from each other may be connected, and, in that case, the number of input signals comes to be a sum thereof.

Subsequently, when the logic of the combinations of 16 sets of 4 inputs is made realizable by use of the circuit shown in FIG. 4, as indicated by broken lines, switch elements S1'–S8' of a PLE 30' is OFF-programmed to release the connection of the coincidence detecting output, and the coincidence signal F of the PLE 30 is connected to a second extension circuit 32' of the PLE 30' to obtain a logical sum F" with a coincidence signal F', and the inputs are connected to each other to establish the following equations.

$I_0' = I_0$ $I_1' = I_1$ $I_2' = I_2$ $I_3' = I_3$ \quad (2)

As a result, the circuit shown in FIG. 4 stores the combinations of 8 sets ×2=16 sets for 4 input signals of I0–I3, so that the extension can be carried out to detect the coincidence.

In general, when the same PLEs capable of storing P sets of the combinations are connected to each other, the number of sets of combinations which can be stored becomes P×R sets (R =2, 3...). Needless to say, PLEs having the numbers of different storages may be connected to each other, and, in that case, the number of sets comes to be a sum thereof.

Figure 5:
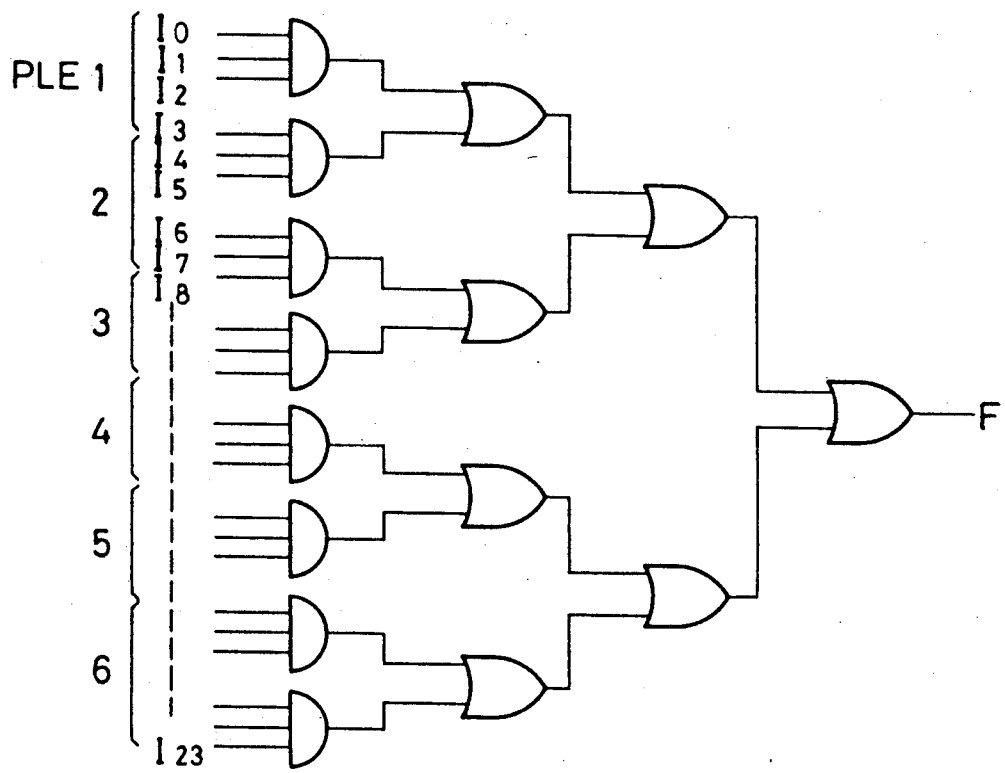
FIG. 5 is a chart in explanation of a method of programming a logic circuit shown in the drawing by use of the above PLE.
Figure 16:
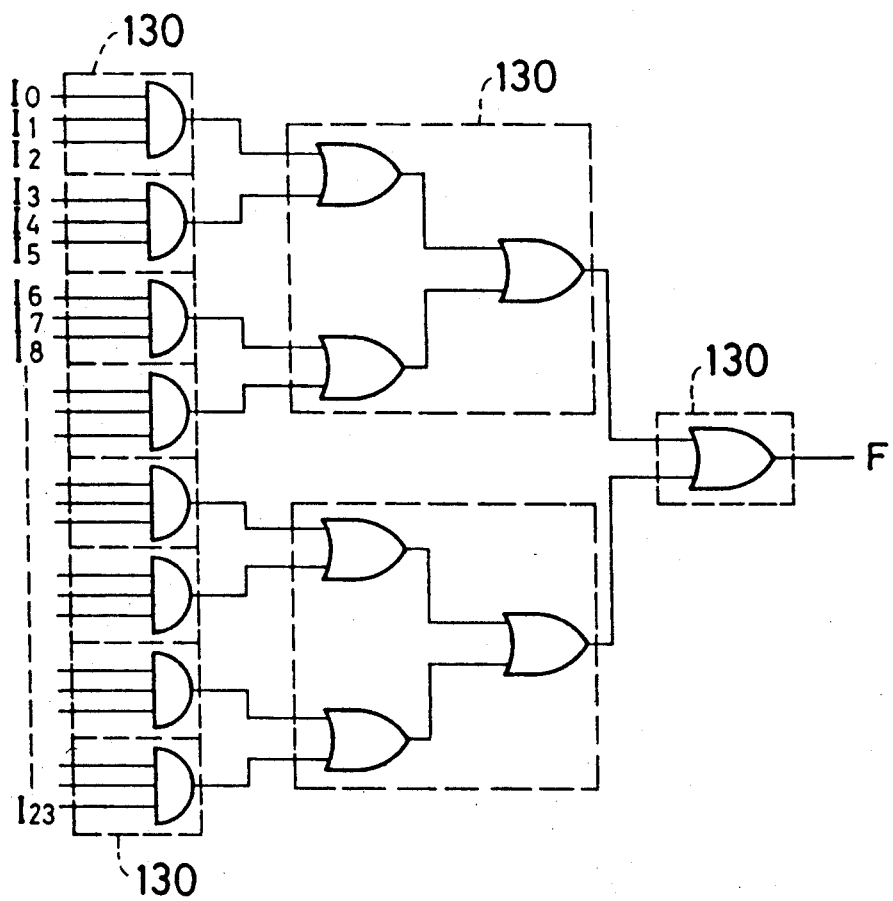
FIG. 16 is a chart in explanation of a method of programming the logic circuit shown in the drawing by a four input table lookup type PLE.

When a logic circuit shown in FIG. 16 is to be realized by use of the four input PLE of this embodiment, as shown in FIG. 5, the combination of input signals to be stored by one PLE 1 is made to be <I0, I1, I2, *> and <*, *, *, I3>, the combination of an adjoining PLE 2 is made to be <I4, I5, *, *> and <*, *, I6, I7>, and the combination of another adjoining PLE 3 is made to be <I8, *, *, *> and <*, I9, I10, I11>, so that the logic of I3·I4·I5 and I6·I7·I8 can be realized by the extension circuits, respectively. Accordingly, by use of 6 (=24 input/4) PLEs, a logic circuit forming an output F having the product term number 8 as represented by the following equation can be constituted.

$$F = I_0 I_1 I_2 + I_3 I_4 I_5 \ldots + I_{21} I_{22} I_{23} \quad (3)$$

Incidentally, wiring for the extension between the PLEs can be replaced by programmable wiring in the PLD.

The second embodiment of the present invention will hereunder be described in detail with reference to FIG. 6. In this embodiment, the PLE 30 similar to the one shown in the first embodiment is further added thereto with programmable selectors 50A, 50B, 50C and 50D capable of replacing input signals into some (or all) of the input signal lines for the aforesaid coincidence detecting circuit (20H, for example) by other input signals.

The other respects are similar to that in the first embodiment, so that detailed description will be omitted.

According to this second embodiment, input signals (feedback signals from flip-flop circuits etc. for example) Q1 and Q2 other than the original four input signals I0–I3 can be input into some (or all) of the coincidence detecting circuits (20H, for example). Accordingly, the product term number usable for the original input signals I0–I3 becomes 7 or less and the number of realizable combinations is limited. However, as in the following equation for example, the product terms I·Q1·Q2 including other input signals Q1 and Q2 can be added, so that the operating efficiency of the PLE, i.e. PCL can be improved in some cases.

$$F = I_0 \cdot I_1 + I_0 \cdot \overline{I_2} + I_0 \cdot I_1 \cdot \overline{I_3} + \ldots + \overline{I_1} \cdot I_2 + I_0 \cdot Q1 \cdot Q2 \quad (4)$$

Figure 7:
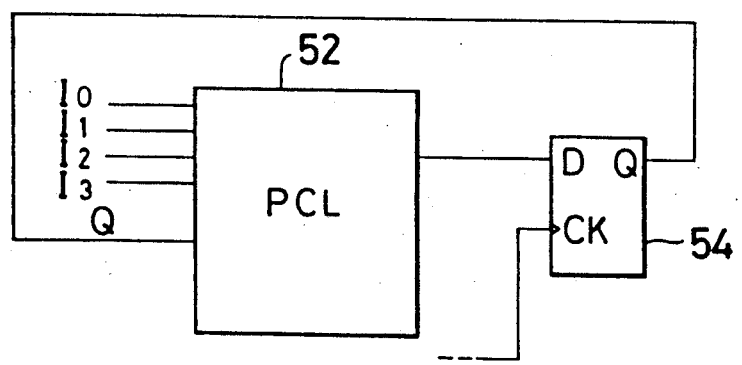
FIG. 7 is a block diagram in explanation of the effects of the second embodiments.

As shown in FIG. 7, particularly, when a circuit constituted by the combination of a simple PCL 52 having a small product term number with a flip-flop circuit 54 is realized, the operating efficiency of PCL can be improved.

What is claimed is:

1. A programmable logic device wherein a plurality of programmable logic elements are provided and said programmable logic elements are optionally connectable to one another characterized in that said plurality of programmable logic elements are each provided with coincidence detecting means, a first extension means and a second extension means, said coincidence detecting means comprises P sets of means for storing combinations of N input signals and generating a coincidence detecting output when the combinations of N input signals coincide with the stored combinations, said first extension means enables said programmable logic elements to store P sets of combinations of M input signals where M is more than N by connecting coincidence detecting outputs from another programmable logic element to the coincidence detecting outputs of the coincidence detecting means of the P sets and has a function of extending to a combinational logic circuit for generating a coincidence when the combination of M input signals coincides with the combination of M input signals stored in P sets, and further, said second extension means has a function of extending to said combinational logic circuit storing the combination of M or N input signals more than P sets by connecting coincidence signals from another programmable logic element to the coincidence signals generated from said first extension means.

2. A programmable logic device as set forth in claim 1, further comprising programmable selectors coupled to said coincidence detecting means for making at least some of input signals into the coincidence detecting means of said programmable logic element replaceable with other input signals.

3. A programmable logic device as set forth in claim 1, wherein said first extension means connects the coincidence detecting outputs from the respective coincidence detecting means to respective coincidence detecting outputs from another programmable logic element to produce logical products, and outputs a total logical sum of said logical products to said second extension means as said coincidence signal.

4. A programmable logic device as set forth in claim 3, wherein said first extension means has output terminals for connecting the logical products between the coincidence detecting outputs from the respective coincidence detecting means and coincidence detecting outputs from another programmable logic element to the other programmable logic element.

5. A programmable logic device as set forth in claim 1, wherein at least some of the coincidence detecting outputs from another programmable logic element, which are input into said first extension means, are input through programmable switch elements.

6. A programmable logic device as set forth in claim 1, wherein said second extension means takes a logical sum between the coincidence signal delivered from said first extension means and a coincidence signal from another programmable logic element.

7. A programmable logic device as set forth in claim 1, wherein said coincidence detecting means is a programmable logic function generating means including:
- a first transfer gate group, into which the positive logics of a plurality of input signals are input;
- a second transfer gate group, into which the negative logics of a plurality of input signals are input;
- a programmable storage element group coupled to said first and second transfer gates for generating signals to turn on either one of said first and second transfer gates and to turn off the other in response to an input signal corresponding thereto; and
- wiring for connecting output terminals of said first and second transfer gates to each other.

8. A programmable logic device as set forth in claim 7, further comprising means for setting "Don't Care" inputs.

9. A programmable logic device wherein optional combinational logic circuits are realized, characterized by including a programmable logic function generating means having:
- a first transfer gate group having a plurality of first transfer gates, into which the true signals of a plurality of input signals are input, each of said first transfer gates having one corresponding input from said input signals;
- a second transfer gate group having a plurality of second transfer gates, into which the compliments of said input signals are input, each of said second transfer gates having one corresponding input from said input signals;
- a programmable storage element group having a plurality of programmable storage elements, each of said storage elements being coupled to a corresponding one of said first and said second transfer gates for generating signals to turn on either one of said first and said second transfer gates and to turn off the other in response to one of said input signals corresponding thereto; and
- wiring for connecting output terminals of corresponding said first and said second transfer gates to each other;

wherein each of said programmable storage elements is provided with means for writing information from outside during circuit configuration, and outputs coincidence detecting output to an output portion connecting said first and said second transfer gate when the input signal coincides with said written information.

10. A programmable logic device as set forth in claim 9, further comprising means for setting "Don't Care" inputs.

* * * * *